United States Patent

De Haas et al.

[11] Patent Number: 5,833,516
[45] Date of Patent: Nov. 10, 1998

[54] METHOD OF MANUFACTURING A PLATE OF ELECTRICALLY INSULATING MATERIAL HAVING A PATTERN OF APERTURES AND/OR CAVITIES

[75] Inventors: Franciscus C. M. De Haas; Franciscus M. H. Van Laarhoven; Johannes G. Van Beek, all of Eindhoven, Netherlands

[73] Assignee: U.S. Philips Corporation, New York, N.Y.

[21] Appl. No.: 671,124

[22] Filed: Jun. 20, 1996

Related U.S. Application Data

[62] Division of Ser. No. 419,977, Apr. 7, 1995, abandoned, which is a continuation of Ser. No. 29,818, Mar. 11, 1993, abandoned.

[30] Foreign Application Priority Data

Mar. 23, 1992 [EP] European Pat. Off. .............. 92200829
Feb. 16, 1993 [EP] European Pat. Off. .............. 93200420

[51] Int. Cl.$^6$ ...................................................... B24C 1/00
[52] U.S. Cl. ................. 451/29; 451/78; 451/38
[58] Field of Search ................................. 451/38, 39, 40, 451/29, 31, 30, 78

[56] References Cited

U.S. PATENT DOCUMENTS

| | | | |
|---|---|---|---|
| 3,270,464 | 9/1966 | Bowling, Jr. ............................ | 451/102 |
| 5,560,743 | 10/1996 | Imayama et al. ........................ | 451/78 |
| 5,593,528 | 1/1997 | Dings et al. ............................. | 451/78 |

FOREIGN PATENT DOCUMENTS

| | | | |
|---|---|---|---|
| 3027190 | 3/1978 | Japan ...................................... | 451/78 |
| 0020861 | 2/1985 | Japan ...................................... | 451/31 |

*Primary Examiner*—Robert A. Rose
*Attorney, Agent, or Firm*—Robert J. Kraus

[57] ABSTRACT

After a plate of electrically insulating, particularly hard and brittle material has been provided with a mask having a very large number of patterned apertures, it is exposed to at least one jet of abrasive powder particles, which jet is moved relative to the plate. In this way a plate is manufactured with a pattern of apertures and/or cavities which are eminently suitable for manipulating electron currents in electronic displays. Plates manufactured in this way may be used, for example, as control plates, spacer plates, or electron transport duct plates in electronic displays.

17 Claims, 6 Drawing Sheets

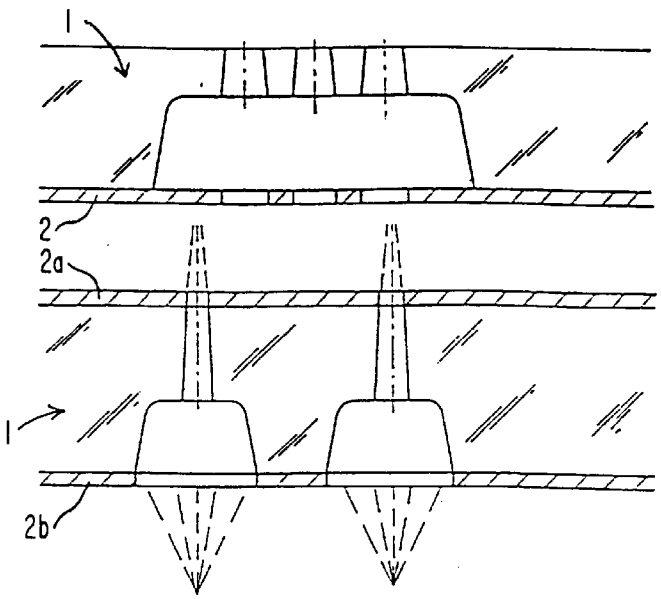
FIG. 10A
FIG. 10B
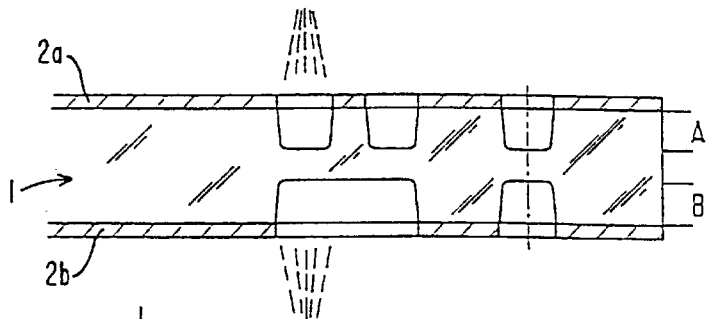
FIG. 11A
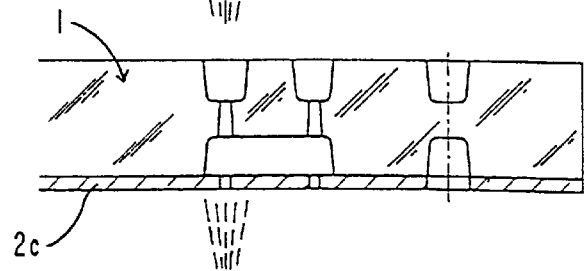
FIG. 11B
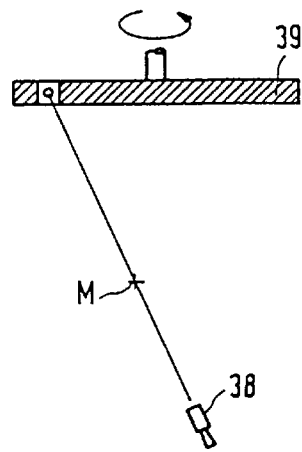
FIG. 12

METHOD OF MANUFACTURING A PLATE OF ELECTRICALLY INSULATING MATERIAL HAVING A PATTERN OF APERTURES AND/OR CAVITIES

This is a division of prior application Ser. No. 08/419,977, filed on 7 Apr. 1995, now abandoned which is a continuation of Ser. No. 08/029,818, filed on 11 Mar. 1993 now abandoned.

BACKGROUND OF THE INVENTION

The invention relates to a method of manufacturing a plate of electrically insulating material having a plurality of cavities and/or apertures arranged in a pattern.

Plates of this type, which may particularly be made of hard, brittle materials such as glass or ceramic material, are particularly used in luminescent gas discharge displays such as plasma displays, in field emission displays, cathode ray displays and in displays in which electrons are propagated in ducts having walls of electrically insulating material (referred to as insulating electron duct displays) in which the apertures or cavities are used for manipulating electron currents. They may be formed as (multi-apertured) control plates and provided with (addressable) electrodes cooperating with the apertures, as transport plates having a plurality of parallel cavities (transport ducts), or as apertured spacers (for example, between a control plate and the luminescent screen of a luminescent display). Further, a use of (thin) wafers of electrically insulating material having a plurality of perforations is e.g. in pressure sensors.

U.S. Pat. No. 3,956,667 describes a luminescent gas discharge display. This display requires a control plate controlling the individual pixels. This control plate divides the inner space of such displays into two areas, a plasma area and a post-acceleration area. It comprises a perforated glass plate having an array of lines at one side and at the other side an array of columns of metal conductors or electrodes surrounding or extending along the perforations. These enable electrons to be selectively drawn from the plasma area through the apertures to the post-acceleration area and to be incident on the luminescent screen.

In the case of a control plate the number of perforations or apertures in a plate of the type described above is defined by the number of desired pixels.

Present-day television line scan patterns use, for example approximately 500×700 pixels having a horizontal pitch of 0.5 mm and a vertical pitch of 0.7 mm. These pixels define the pattern of apertures to be provided in the control plate of electrically insulating material. These apertures or perforations are conventionally provided by means of chemical etching (liquid etching, gas phase etching). However, when standard materials and chemical etching methods are used, the plate thickness, the aperture diameter and the pitch of the apertures cannot be chosen independently of each other. Moreover, if metal tracks are provided on the plate to be etched, there is the risk that underetching of the glass under the tracks may cause the tracks to come loose from the glass. It is also difficult to achieve the required accuracy in the use of chemical etching methods when the plates are relatively thick (thicker than approximately 200 microns, particularly thicker than 400 microns).

SUMMARY OF THE INVENTION

It is an object of the invention to provide a (preferably simple) method of manufacturing a plate which is particularly suitable for the uses described hereinbefore and offers the possibility of setting a large number of parameters for providing a desired pattern of cavities and/or apertures in coated (for example metallized) or uncoated plates of electrically insulating material.

The method according to the invention is therefore characterized in that the pattern is made by means of the following steps:
producing at least one jet of abrasive powder particles;
directing the jet onto a surface of the plate;
limiting the areas where the jet impinges upon the surface;
performing a relative movement between the jet and the plate.

As compared with the state-of-the-art etching processes, the use of such a powder spraying process for making a pattern of apertures or cavities in a plate of electrically insulating material has the advantage that a large number of parameters is available, inter alia, the type of abrasive, grain size, diameter of the nozzle emitting the abrasive particles, nozzle/plate distance, pressure of the medium with which the powder particles are transported, movement of the nozzle, speed of the relative movement between nozzle and plate. By varying these parameters it has been found possible to make plates with a pattern of apertures and/or cavities which comply with the requirements imposed on the use in displays. The step of changing over from a chemical etching process to a powder spraying process for making patterns having a great many densely arranged apertures in electrically insulating plates for (electroluminescent) displays appears to lead to a number of unforeseen advantages in the industrial manufacture of such devices.

To cause the jet to impinge on limited areas only, the jet can be given a limited diameter and moved across the plate for forming a slotted aperture or a duct. The invention provides for the use of a mask if a pattern having a large number of small apertures is to be provided. (The use of a mask is also advantageous for the formation of the aforementioned slotted apertures and ducts.)

The mask used may be formed from, for example a patterned photoresist or a synthetic material.

The use of a perforated (particularly metal) plate as a mask is found to be very suitable. This plate can be used a number of times in a number of cases, particularly if it is provided in advance with a protective coating.

When a separate metal or synthetic material plate is used as a mask, it is advantageous to stick this mask to the plate to be sprayed. An easily removable adhesive can be used for this purpose. An interesting alternative is the use of a plate of a magnetisable metal, for example Fe for the mask and "sticking" this plate to the plate to be sprayed by means of a magnetic field generated at the other side of the plate to be sprayed. When an electromagnet is used, the magnetic attraction can be easily switched on and off.

Sticking is important to maximally prevent the mask from being locally detached during spraying, causing powder particles to come underneath the mask and possibly damage the parts not to be sprayed (referred to as underspraying).

BRIEF DESCRIPTION OF THE DRAWINGS

These and other aspects of the invention will be apparent from and elucidated with reference to the embodiments described hereinafter.

In the drawing

FIGS. 10a, 10b, 11a and 11b show, in cross section, communicating cavities formed from opposite side of plates.

FIG. 12 shows diagrammatically how a spray nozzle may be rotated about a fixed point.

DESCRIPTION OF THE PREFERRED EMBODIMENTS

Electrically insulating control plates, transport plates and/or spacer plates having very accurate patterns of apertures and/or cavities are required for use in different types of (electroluminescent) displays. The plate thickness may be between 200 and 5000 microns, particularly between 200 and 700 microns. The depths of the apertures or cavities may range between 50 and 5000 microns. A characteristic material for these applications is glass or ceramic material.

Figure 1:
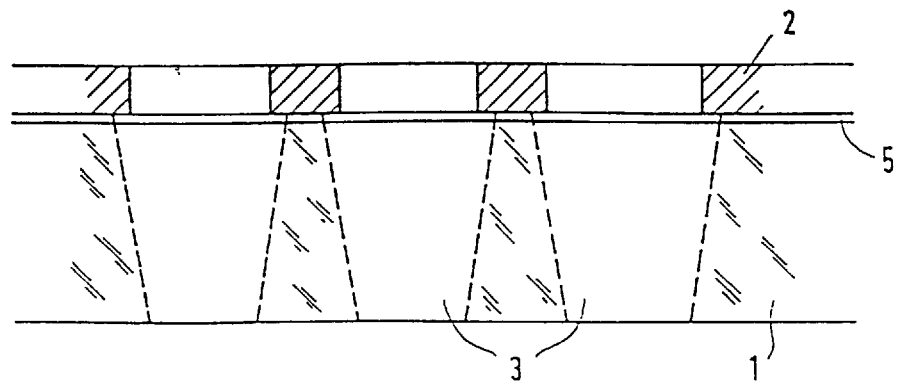
FIG. 1 is a cross-sectional view of a plate provided with a perforated mask.

FIG. 1 is a cross-sectional view of such a plate 1 provided with a metal mask 2. Suitable metals are those which are easily etchable. A mask of Fe is slightly attacked by the abrasive powder spraying process used in accordance with the present invention to provide apertures 3 in the plate 1. An alternative material is (stainless) steel or an invar alloy (NiFe). Instead of a metal mask, which has the advantage that it can be used several times (for example, several dozen times), a lacquer mask (for example, a lacquer used in the silk-screening technique) or a synthetic material mask (for example, an UV-sensitive synthetic material) can be used.

Figure 2:
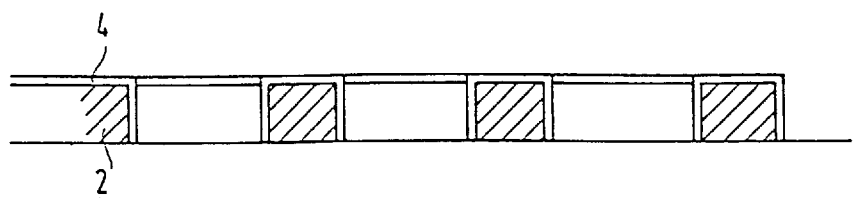
FIG. 2 is a cross-sectional view of a perforated mask provided with a protective coating.

The metal mask 2 may be provided with a protective coating 4 (FIG. 2) of, for example electrolytically provided nickel or chromium or of vapour-deposited aluminium. A coating of a synthetic material may alternatively be provided. A loose mask can be stuck on the plate 1 by means of an adhesive layer 5 so as to inhibit local detaching during the powder spraying process. The adhesive layer 5 may comprise an adhesive which is soluble in water (for example, an adhesive based on glucose). Such an adhesive can be easily provided at low cost and simply removed after use. The mask 2 may be alternatively made of a magnetic material and "stuck" to the plate 1 by means of a magnetic field.

The apertures 3 denoted by broken lines in the plate 1 are slightly tapered in the embodiment of FIG. 1. When plates are used as internal vacuum supports (spacer plates) in field emission displays, such an aperture shape is not unusual for making cylindrical apertures or cavities with parallel walls. Plates having cylindrical apertures are suitable, for example, as spacers between a control plate and the luminescent screen in an insulating electron duct display.

Figure 3:
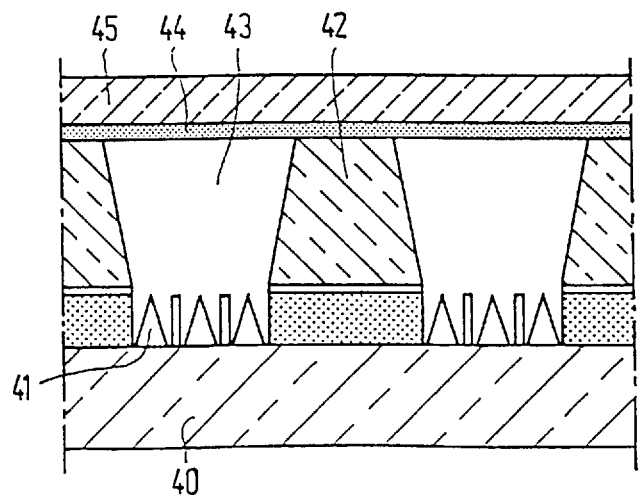
FIG. 3 is a cross-sectional view of a field emission display.

FIG. 3 is a diagrammatic cross-sectional view of a field emission display comprising a substrate 40, conical emission tips 41, a spacer plate 42 with apertures 43 and a front wall 45 with a luminescent screen 44. The spacer plate 42 may advantageously be made by means of the method according to the invention.

Figure 4A:
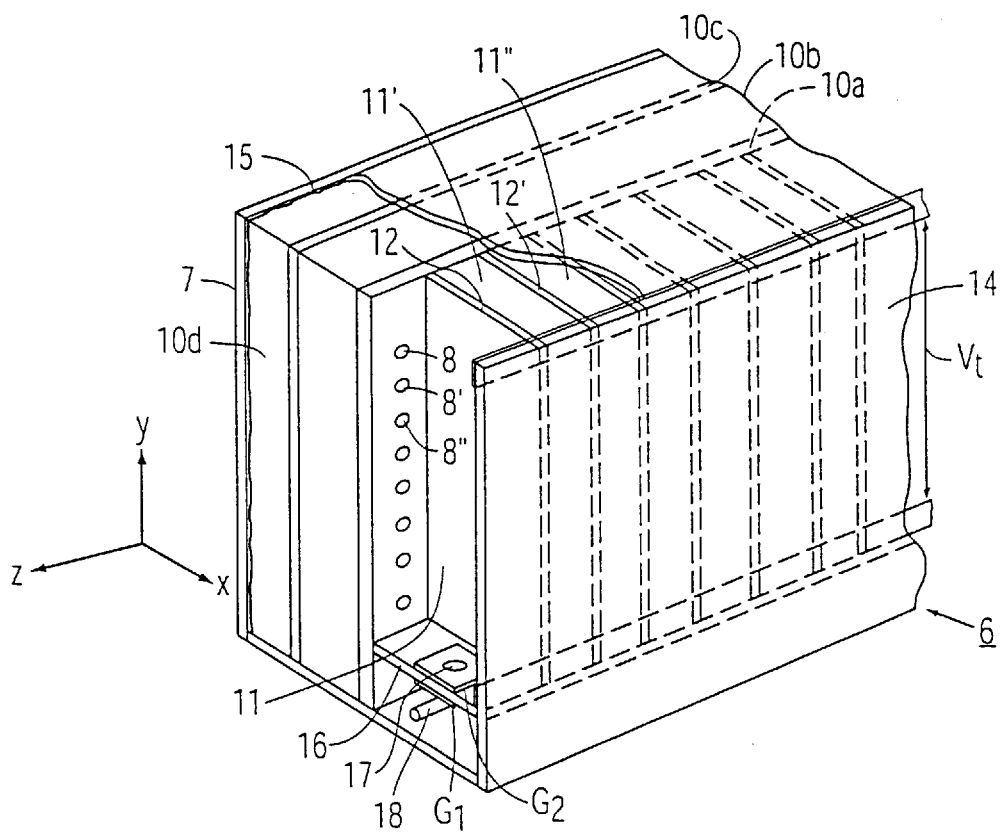
FIG. 4a is an elevational view.
Figure 4B:
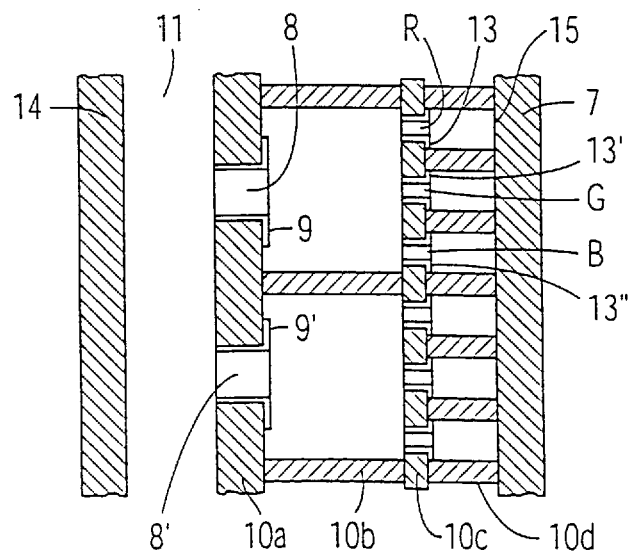
FIG. 4b is a cross-sectional view of an insulating electron duct display.

FIG. 4a is a diagrammatic elevational view and FIG. 4b is a cross-sectional view of an insulating electron duct display 6 as described in EP-A-400 750. This display comprises a plurality of insulator plates 10a, 10b, 10c, 10d having regular aperture patterns between a transparent face plate 7 and a rear wall 14.

A luminescent screen 15 is provided on the inner surface of the face plate 7. A flu-spacer plate 10d having a characteristic thickness of approximately 1 mm and, for example $1 \times 10^6$ apertures corresponding to the number of luminescent areas (colour dots) on the screen 15 is adjacent to this luminescent screen. The colour dots are addressed by means of a preselection plate 10a and a fine-selection plate 10c each of, for example glass and being 0.5 mm thick. The plate 10c has a pattern of aperture triplets R, G, B in this case. The apertures in the plate 10c are activated, for example row by row by means of metal fine-selection electrodes 13, 13', 13", . . . . These electrodes may be provided after the apertures have been made, which provides the possibility of metallizing the walls of the apertures as well. An alternative method is to provide the fine-selection electrodes in advance. Preselection plate 10a is separated from fine-selection plate 10c by a spacer structure 10b, in this case a plate having (large) apertures connecting each one of, for example 350,000 apertures 8, 8', . . . in the preselection plate 10a with a plurality of apertures in the fine-selection plate 10c. The preselection plate 10a is provided with preselection electrodes 9, 9', . . . for activating, for example row by row the apertures 8, 8', . . . communicating with electron transport ducts 11, 11', 11", . . . (see also FIG. 4a). The transport ducts 11, 11', 11", . . . are separated from each other in this case by electrically insulating partitions 12, 12', 12", . . . . An alternative method is to provide the transport ducts (a total number of several hundred, for example 200 or 400) as duct-shaped cavities having a depth of several mm and a width of, for example 0.5 or 1 mm in the rear wall 14. The method according to the invention is also applicable for this purpose. The rear wall 14 constitutes an electron transport plate in this case. The transport ducts 11, 11', 11", . . . cooperate, via a perforated cathode plate 16 (of, for example 1 mm thick glass) with a-line-shaped-electron source 18. The apertures 17 in the cathode plate 16 (also several hundred, for example 200 or 400) may also be provided advantageously by means of the method according to the invention.

In connection with the large number of perforated, relatively thick plates (at least four), the very large numbers of apertures, the necessity of a continuous or strip-shaped coating on a plurality of these plates, the invention also facilitates the manufacturer of "insulating electron duct displays" of the type shown in FIGS. 4a and 4b on an industrial scale.

Figure 5:
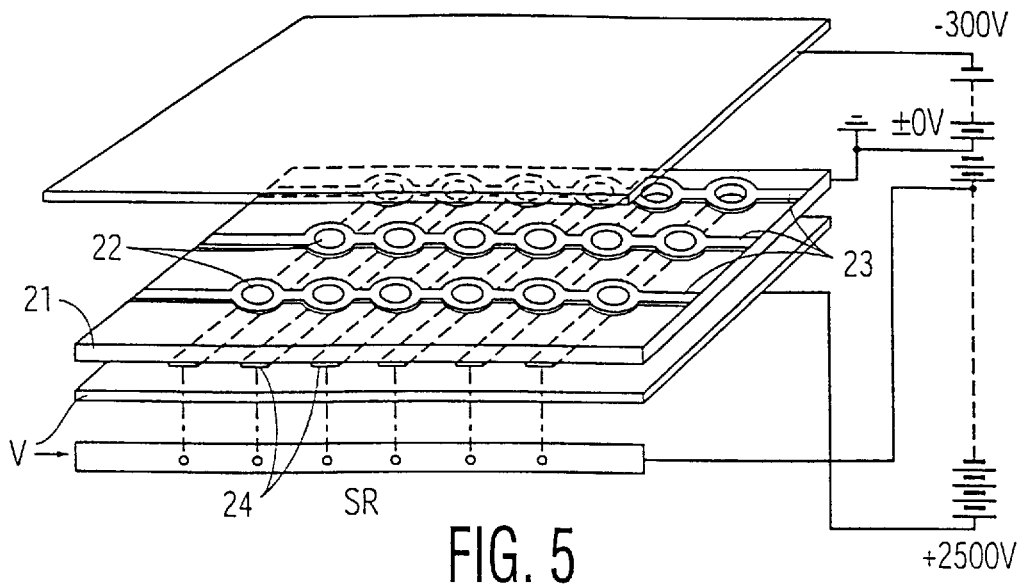
FIG. 5 is a cross-sectional view of a gas discharge display.

FIG. 5 is an elevational view of a gas discharge display as described in DE-2 412 869, corresponding to U.S. Pat. No. 3,956,667. This display has an insulator plate 21 provided with a regular pattern of apertures 22. Row conductors 23 extend at one side across the apertures 22. These conductors are provided by means of, for example a printing technique, vapour deposition or photolithography. Column conductors 24 extend across the other side of the apertures 22. DE-2 412 869 is referred to for the operation of such a display. The insulator plate 21 may advantageously be made by means of the method according to the invention.

Figure 6:
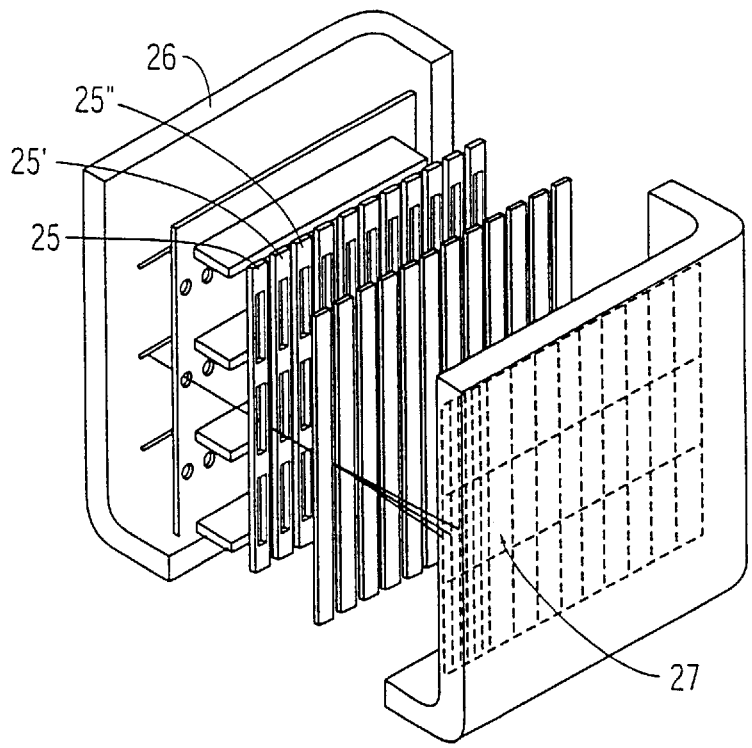
FIG. 6 is an exploded view of a flat panel display.

FIG. 6 is an elevational view of a flat panel display as presented in publications by MEI. This display comprises a large number of metal electron beam control electrodes 25, 25', 25", . . . provided with slotted apertures between a rear wall 26 and a luminescent screen 27. These electrodes can be provided by means of the invention on a plate of electrically insulating material having the same aperture pattern, which has great advantages as regards ease of handling and suspension.

Figure 7:
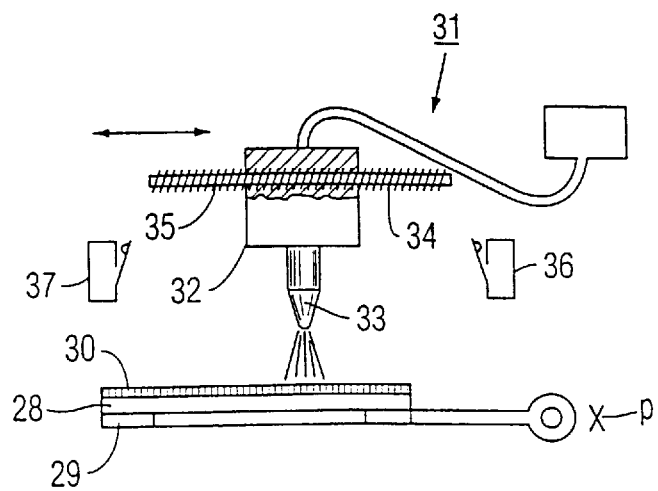
FIGS. 7 and 8 show diagrammatically how a pattern of apertures is provided in a plate by means of a powder spraying device.
Figure 8:
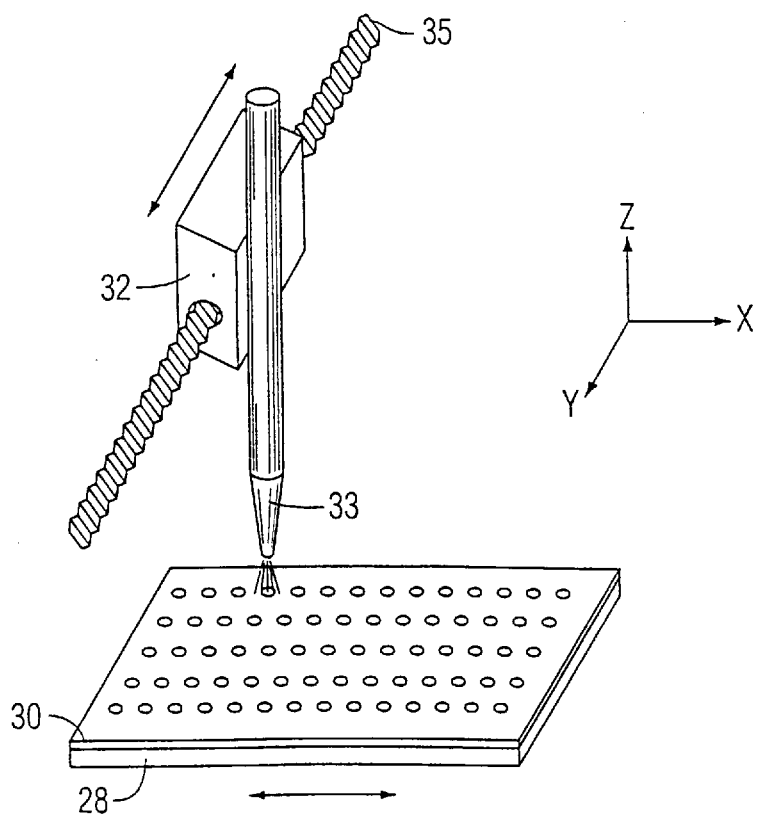

FIG. 7 shows a plate 28 to be sprayed, which plate is positioned on a support 29. The support 29 is movable in the direction of the arrow P perpendicular to the plane of the drawing. The plate 28 is provided with a mask 30 having the shape of a perforated metal plate. In this example the mask 30 has a regular pattern of circular apertures (see FIG. 8). A device 31 for performing an abrasive operation (powder spraying device) is shown diagrammatically as a spraying unit 32 having a nozzle 33 directed onto the surface of the plate 28. Dependent on whether apertures or cavities are to be made, the nozzle/mask distance may range between 0.5 and 25 cm, typically between 2 and 10 cm. During operation a jet of abrasive powder particles, for example silicon carbide particles, aluminium oxide particles, granulated glass or steel or mixtures thereof is blown from the nozzle 33. A pressure principle or a venturi principle may be used for this purpose. Abrasive particle dimensions suitable for the object of the invention range between 1 and 200 microns, typically between 10 and 100 microns.

In this embodiment spraying unit 32 with nozzle 33 can be traversed in a direction transverse to the arrow P by means of a traversing device 34 which has a spindle 35.

Stops provided with electric contacts are denoted by the reference numerals 36 and 37 and are assumed to be connected to a reversing circuit so as to reverse the sense of rotation of the spindle 35 to be driven by a motor.

During operation the support 29 and the plate 28 make a, for example reciprocating movement parallel to the X axis and the spraying unit 32 performs axial traversing movements parallel to the Y axis (FIG. 8), the speeds of movement being adapted to each other in such a way that the complete desired aperture or cavity pattern is obtained in the plate 28. Instead of one nozzle it is possible (for example, for the purpose of accelerating the process) to use a number of nozzles for spraying areas which are spaced apart, are tangent to each other, or partially or completely overlap each other.

Figure 9C:
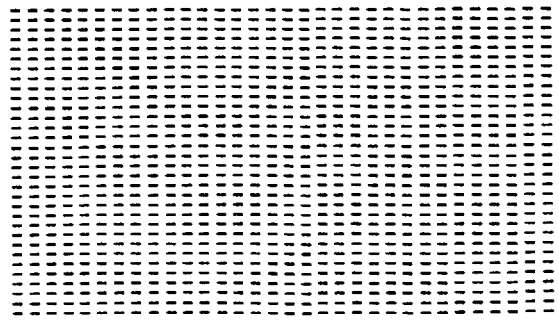
FIGS. 9a, 9b and 9c show various patterns of apertures realised in this manner.
Figure 9B:
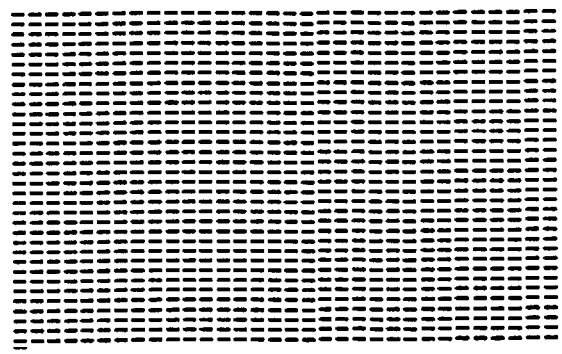
Figure 9A:
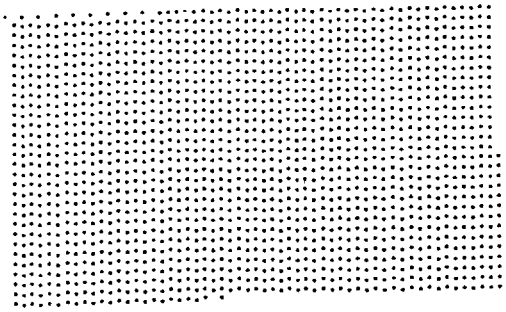

FIG. 9a shows in real size a part of a pattern of circular apertures obtained in this manner.

FIGS. 9b and 9c show patterns of slotted apertures obtained in similar manners.

A 0.5 mm thick plate of 30×40 cm can be provided with a very accurate aperture pattern of $1 \times 10^6$ apertures having a diameter of 600 microns within 5 minutes in the manner described above.

For insulating electron duct displays of the FIG. 4 type, four perforated plates are required, with aperture patterns having a number of apertures varying between $100 \times 10^3$ and $10 \times 10^6$.

The invention may alternatively be used for providing a large number of parallel elongate cavities in a plate of electrically insulating material, which cavities are used as electron transport ducts in an insulating electron duct display. The display shown in FIG. 4a comprises several hundred (for example, 400) of such electron transport duct cavities 11, 11', 11", . . . etc.

The invention is not only suitable for unilaterally providing a pattern of apertures or cavities but also for providing patterns of cavities at both sides. The cavities can be provided in such a way that they communicate with one another, for example each cavity at one side of a plate 1 communicates with two or more cavities at the other side of a plate 1 (FIG. 10a) or each cavity at one side communicates with one cavity (equally large as the first cavity, or different in size) at the other side (FIG. 10b). This provides the possibility of manufacturing one plate 1 that serves as two. This results in a greater ease of handling during the manufacturing process.

FIGS. 11a and 11b show how one plate 1 that serves as three can be made. First, a sub-pattern of cavities is made in each one of the facing surfaces of the plate 1 through masks 2a and 2b, which cavities do not communicate with one another (FIG. 11a). In a subsequent powder spraying step, in which a mask 2c arranged on one of the surfaces is used, corresponding cavities are connected to each other by providing perforations (FIG. 11b).

It is to be noted that duct-shaped cavities, as previously mentioned in connection with the construction of FIG. 4, can be made without using a mask, for example by producing at least one localized powder jet and by moving it once or a number of times across the plate at the location where the duct is to be made.

If the powder spraying process is performed at a relatively high speed ("high-speed spraying"), it is preferable to cool the metal mask by cooling, for example the glass plate by means of a flow of liquid. Heating of the metal mask may alternatively be inhibited by using a synthetic material coating which ensures that the powder particles not passing through the apertures rebound more or less elastically.

In the powder spraying process the shaping of the apertures may be enhanced if the plate to be sprayed is supported by a plate having a pattern of apertures which is exactly located under the aperture pattern to be sprayed. The plate to be sprayed may alternatively be supported at its edges only, at locations where it is not apertured.

When using a nozzle which is substantially perpendicular to the plate surface, apertures having slightly tapering walls will be obtained. Dependent on the geometries used, the walls may extend at an angle of between several degrees and 20 degrees to the normal on the plate surface. The taper may be limited by performing the abrasion process from both plate surfaces.

Apertures (and cavities) having walls which are transverse to the plate surface can be obtained within the scope of the invention by causing a nozzle, which is arranged obliquely to the surface, to rotate about a fixed point during the powder spraying process so that it describes, for example, a surface of a cone. To this end the nozzle (the spray pipe) 38 can be placed in a holder having a point of rotation M and rotated with the aid of a template arranged above this holder. See FIG. 12.

An alternative to the above-mentioned method is the use of a plurality of stationary nozzles which are arranged in such a way that during the powder spraying process the object is sprayed from different directions at an angle to the normal on the object surface. Suitable results were achieved, for example, with six nozzles placed at the vertices of a regular hexagon, with each nozzle in a plane parallel to one of the sides of the hexagon and extending at an angle $\alpha$ to the normal on the object surface. In most cases an angle $\alpha$ of between 10° and 50° was satisfactory for obtaining cavities and/or apertures having walls extending transversely to the object surface.

Plates manufactured by using the inventive method may contain at least one and in most cases a very large number of holes (and/or cavities) which are placed close together so that they constitute at least approximately 30% or even more than approximately 50% of the exposed surface area of the plate. As mentioned already areas of utility are, amongst, others various types of electronic displays where plates having arrays of e.g. one hundred thousand, several hundred thousands, or more holes are utilized to control electron propagation. Other areas of utility are e.g. electron tubes of the image intensifier type where the output electrons are directed towards a phosphor surface which emits light upon being struck by electrons, or where the output electrons are being utilized directly, e.g. for the exposure of a photographic film.

What is claimed is:

1. A method of forming in a plate of electrically insulating material a multiplicity of precisely-positioned passages between opposite first and second sides of the plate, said method including the steps of:
   a. adhesively attaching to at least one of the sides of the plate a mask having apertures located at predefined areas where the passages are to be formed;
   b. producing at least one let of abrasive powder particles;
   c. directing the at least one jet at a surface of the mask to effect abrasion of the electrical insulating material through the apertures of said mask; and
   d. moving at least one of the plate and the at least one jet relative to the other to effect formation of the passages at the predefined areas;
   where the passages comprise:
      cavities in the first side of the plate formed by directing the at least one jet of abrasive powder particles at a first mask attached to said first side; and
      cavities in the second side of the plate formed by directing the at least one jet of abrasive powder particles at a second mask attached to said second side;
      at least one of the cavities in the first side communicating with a plurality of the cavities in the second side.

2. A method of forming in a plate of electrically insulating material a multiplicity of precisely-positioned passages between opposite first and second sides of the plate, said method including the steps of:
   a. adhesively attaching to at least one of the sides of the plate a mask having apertures located at predefined areas where the passages are to be formed;
   b. producing at least one jet of abrasive powder particles;
   c. directing the at least one jet at a surface of the mask to effect abrasion of the electrical insulating material through the apertures of said mask; and
   d. moving at least one of the plate and the at least one jet relative to the other to effect formation of the passages at the predefined areas;
   where the passages comprise:
      cavities in the first side of the plate formed by directing the at least one jet of abrasive powder particles at a first mask attached to said first side; and
      cavities in the second side of the plate formed by directing the at least one jet of abrasive powder particles at a second mask attached to said second side;
      at least one of the cavities in the first side communicating with 3. A method as in claim 1 or 2 where at least one of the passages comprises an intermediate aperture in a midsection of the plate formed, after forming the cavities in one of the first and second sides, by directing at least one jet at a third mask attached to said side, said intermediate aperture connecting one of the cavities in the first side with one of the cavities in the second side.

4. A method as in claim 1 where the mask comprises a radiation-sensitive synthetic material.

5. A method as in claim 1 where the mask is attached to the plate by means of a readily-removable adhesive.

6. A method as in claim 5 where the adhesive is water soluble.

7. A method as in claim 6 where the adhesive comprises glucose.

8. A method as in claim 1 where the mask comprises a metallic material having a protective coating on a side of the mask which is exposed to the at least one jet of abrasive powder particles.

9. A method as in claim 8 where the protective coating comprises a material selected from the group consisting of nickel, chromium and aluminum.

10. A method as in claim 8 where the protective coating comprises a synthetic material for effecting elastic rebound of the abrasive powder particles.

11. A method as in claim 1 where the at least one jet of abrasive powder particles is directed obliquely at the surface of the mask.

12. A method of forming in a plate of electrically insulating material a multiplicity of precisely-positioned passages between opposite first and second sides of the plate, said method including the steps of:
   a. adhesively attaching to at least one of the sides of the plate a mask having apertures located at predefined areas where the passages are to be formed;
   b. producing at least one jet of abrasive powder particles;
   c. directing the at least one jet at a surface of the mask to effect abrasion of the electrical insulating material through the apertures of said mask; and
   d. moving at least one of the plate and the at least one jet relative to the other to effect formation of the passages at the predefined areas;
   where the at least one jet of abrasive powder particles is directed obliquely at the surface of the mask and is rotated to describe a conical surface.

13. A method as in claim 1 where the at least one jet of abrasive particles comprises a plurality of said jets produced by respective nozzles aimed in different directions.

14. A method as in claim 13 where the nozzles are positioned at vertices of a polygon.

15. A method as in claim 14 where the polygon comprises a hexagon.

16. A method as in claim 13 where the plurality of jets overlap each other.

17. A method as in claim 1 where the movement of the plate and the at least one jet relative to the other is performed by scanning said at least one jet of abrasive powder particles over the mask.

* * * * *

UNITED STATES PATENT AND TRADEMARK OFFICE
CERTIFICATE OF CORRECTION

| | |
|---|---|
| PATENT NO. | : 5,833,516 |
| DATED | : November 10, 1998 |
| INVENTOR(S) | : Franciscus C.M. De Haas, Franciscus M.H. Van Laarhoven, Johannes G. Van Beek |

It is certified that error appears in the above-identified patent and that said Letters Patent is hereby corrected as shown below:

<u>Column 7,</u>
Line 19, change "let" to -- jet --.
Line 62, after "with" insert -- a respective one of the cavities in the second side --.

Signed and Sealed this

Twenty-sixth Day of November, 2002

Attest:

Attesting Officer

JAMES E. ROGAN
*Director of the United States Patent and Trademark Office*